(12) United States Patent
Schinkel

(10) Patent No.: US 10,659,028 B2
(45) Date of Patent: May 19, 2020

(54) DIGITAL AUDIO CONVERTER AND AMPLIFIER CONTROLLER

(71) Applicant: Axign B.V., Enschede (NL)

(72) Inventor: Daniel Schinkel, Enschede (NL)

(73) Assignee: AXIGN B.V., Enschede (NL)

( * ) Notice: Subject to any disclaimer, the term of this patent is extended or adjusted under 35 U.S.C. 154(b) by 0 days.

(21) Appl. No.: 16/093,844

(22) PCT Filed: Apr. 10, 2017

(86) PCT No.: PCT/NL2017/050222
§ 371 (c)(1),
(2) Date: Oct. 15, 2018

(87) PCT Pub. No.: WO2017/179974
PCT Pub. Date: Oct. 19, 2017

(65) Prior Publication Data
US 2019/0081621 A1    Mar. 14, 2019

(30) Foreign Application Priority Data

Apr. 14, 2016 (NL) ..................................... 2016605

(51) Int. Cl.
*H03K 7/08* (2006.01)
*H03F 3/217* (2006.01)
(Continued)

(52) U.S. Cl.
CPC ............... *H03K 7/08* (2013.01); *H03F 3/217* (2013.01); *H03F 3/2178* (2013.01);
(Continued)

(58) Field of Classification Search
CPC ........... H03F 2200/03; H03F 2200/351; H03F 3/217; H03F 2200/331; H03F 3/2178;
(Continued)

(56) References Cited

U.S. PATENT DOCUMENTS 6,498,531 B1    12/2002  Ulrick et al.
7,378,904 B2 *   5/2008  Risbo ...................... H03F 3/217
                                                           330/10
(Continued)

FOREIGN PATENT DOCUMENTS

DE    102012102504    9/2012
WO    2002/078179    10/2002
(Continued)

OTHER PUBLICATIONS

Forzley, Tony, and Ralph Mason. "A low power Class D audio amplifier with discrete time loop filter compensation." 2009 Joint IEEE North-East Workshop on Circuits and Systems and TAISA Conference. IEEE, 2009. (Year: 2009).*
(Continued)

*Primary Examiner* — Ryan Johnson
(74) *Attorney, Agent, or Firm* — Peacock Law P.C.; Janeen Vilven; Justin Muehlmeyer

(57) ABSTRACT

The present invention is in the field of programmable pulse width modulator (PWM) controller comprising filters and a mixer, such as for use in a digital audio converter and digital amplifier controller, a chip comprising said PWM controller, a device comprising said PWM controller or said chip, as well as uses thereof.

18 Claims, 9 Drawing Sheets

(51) Int. Cl.
*H03M 1/12* (2006.01)
*H04R 1/00* (2006.01)
*H04S 3/00* (2006.01)

(52) U.S. Cl.
CPC .......... *H03M 1/1245* (2013.01); *H04R 1/005* (2013.01); *H03F 2200/03* (2013.01); *H03F 2200/351* (2013.01); *H04S 3/008* (2013.01)

(58) Field of Classification Search
CPC ......... H03M 3/506; H03K 7/08; H04R 1/005; H04S 3/008
See application file for complete search history.

(56) References Cited

U.S. PATENT DOCUMENTS

| | | | |
|---|---|---|---|
| 8,188,721 B2* | 5/2012 | Isham | H02M 3/156 |
| | | | 323/282 |
| 2005/0052304 A1 | 3/2005 | Trotter et al. | |
| 2006/0251197 A1* | 11/2006 | Zaucha | H04S 3/008 |
| | | | 375/350 |
| 2007/0152750 A1* | 7/2007 | Andersen | H03F 1/32 |
| | | | 330/136 |

FOREIGN PATENT DOCUMENTS

| | | |
|---|---|---|
| WO | 2009/153449 | 12/2009 |
| WO | 2009/153450 | 12/2009 |
| WO | 2013/164229 | 11/2013 |
| WO | 2014/094913 | 6/2014 |
| WO | 2017/179974 | 10/2017 |

OTHER PUBLICATIONS

Adduci, Pietro, et al., "Switching Power Audio Amplifiers with High Immunity to the Demodulation Filter Effects", JAES, vol. 60, Issue 12, 2012, 1015-1023.

Iftekharuddin, Khan M., et al., "Butterfly interconnection network: design of multiplier flip-flop, and shift register", Applied Optics, vol. 33, No. 8, 1994, 1457-1462.

Mouton, Toit, et al., "Digital Control of a PWM Switching Amplifier with Global Feedback", AES 37th International Conference, 2009, 1-10.

* cited by examiner

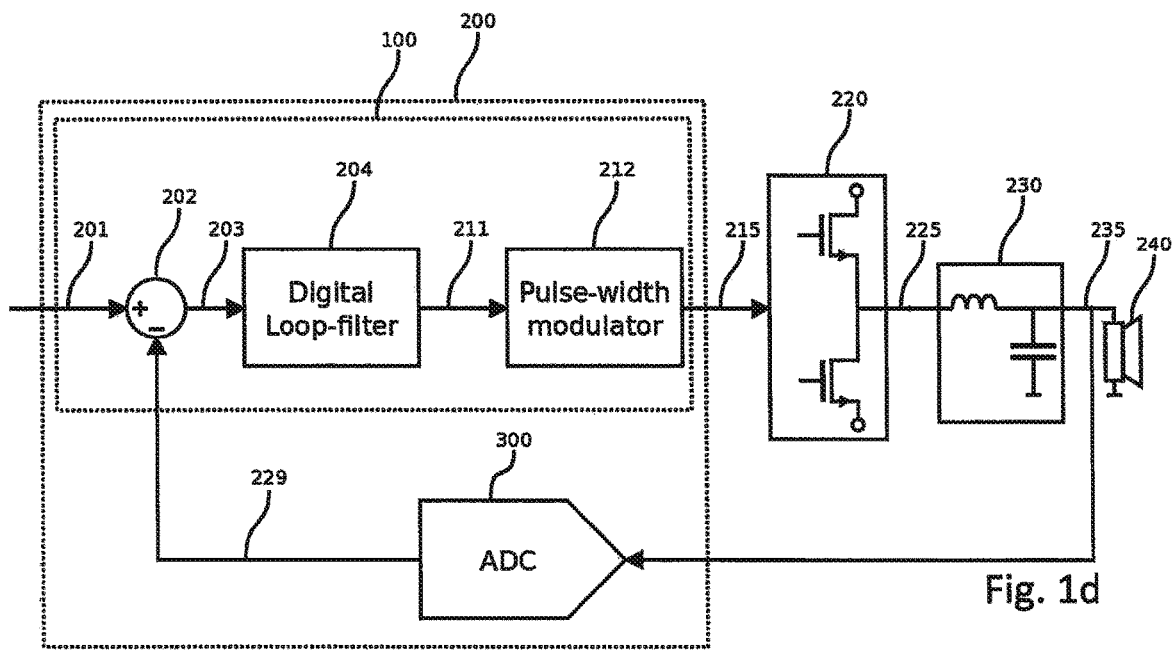
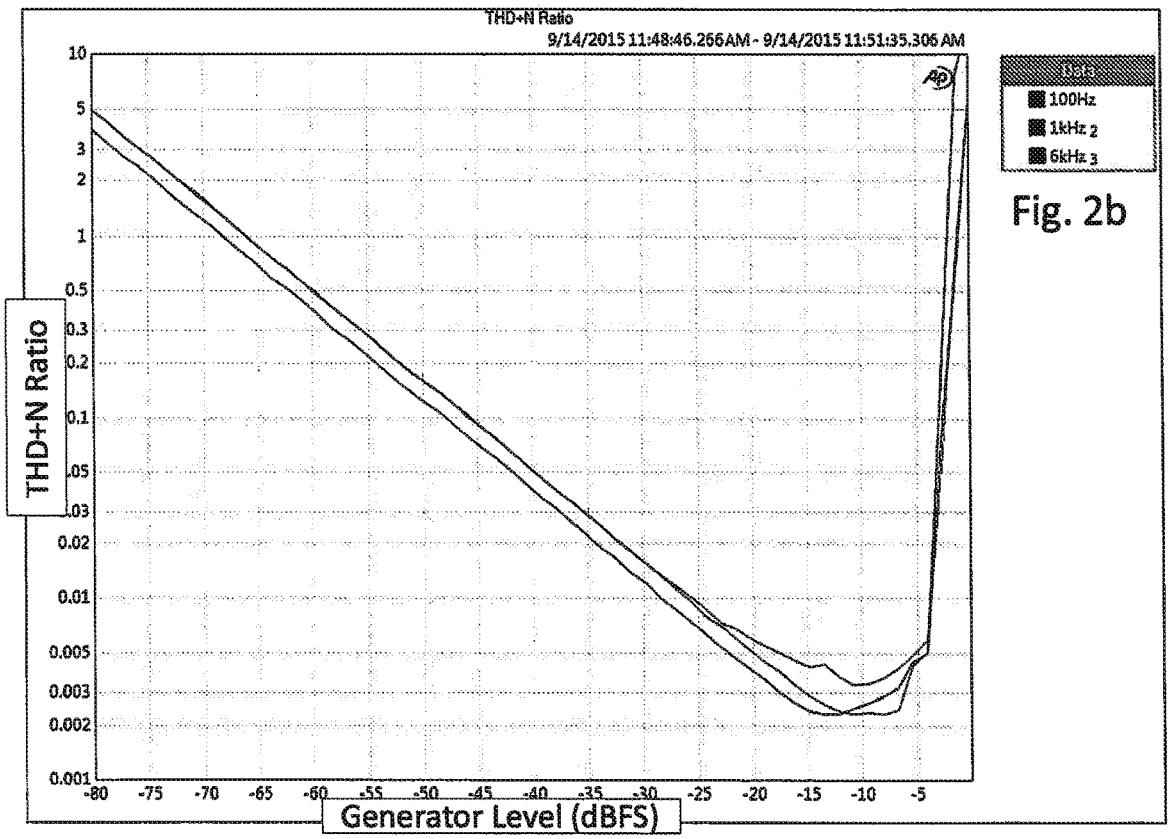
Fig. 2b

DIGITAL AUDIO CONVERTER AND AMPLIFIER CONTROLLER

FIELD OF THE INVENTION

The present invention is in the field of programmable pulse width modulating (PWM) controller comprising filters and a mixer, such as for use in a digital audio converter and digital amplifier controller, a chip comprising said PWM controller, a device comprising said PWM controller or said chip, as well as uses thereof.

BACKGROUND OF THE INVENTION

The present invention relates in an aspect to a digital controller that outputs pulse-width modulated (PWM) signals and uses feed-back of the output signal to correct for any errors. It further relates to an implementation where the feedback signal is derived from the output of an analog to digital converter (ADC), to create a 'mixed-signal PWM controller'.

A primary application of such a controller is an audio amplifier, where the PWM signal can be used to drive a switching (class-D) amplifier. After the switching amplifier there is usually an output filter provided to remove high-frequency switching components and make a smooth output signal. Said output signal may be fed to a speaker. The ADC in such a controller is capable of measuring the signal directly at the speaker, i.e. after the output filter. The digital controller can subsequently be configured further e.g. to have a high loop gain to suppress non-idealities in the signal that may arise in the switching amplifier and the output filter.

Traditionally switching amplifiers used either no feedback at all (FIG. 1a), or they used analog feedback loops with a feedback taken before an output filter (FIG. 1b). These analog systems usually have only moderate filter complexity (most commonly a $2^{nd}$ order loop-filter). This is found to result in less loop-gain and less suppression of non-idealities from the switching amplifier, and even no suppression at all for non-idealities that originate in the output filter.

It is in principle possible to increase the gain of an analog feedback loop by increasing its filtering order. However, this is not often done, as the variability of analog filter components requires either a complex calibration mechanism, or requires a significant back-off margin to allow for tolerances. A back-off margin mitigates most of the advantage of a higher-order filter.

It is also possible to use analog loop-filters with feedback after the output filter (see FIG. 1c) [Adduci et al. in "Switching Power Audio Amplifiers with High Immunity to the Demodulation Filter Effects", J. Audio Eng. Soc. Vol. 60, No. 12, December 2012]. However, to keep a loop-filter stable further measures have to be taken typically, such as the output filter has to be compensated. In an analog case compensation of the output filter is usually done with a secondary local feedback loop. This is found to reduce an effectiveness of error suppression of the outer loop (at high frequencies) and in addition requires large passive components that also need to be programmable to track component variations in the output filter.

Compensation of the (LC) output filter could be more efficient in the digital domain. With careful design of a digital compensation filter, such is possible in a single loop with full global feedback (see FIG. 1d) [Mouton et al. in "Digital Control of a PWM Switching Amplifier with Global Feedback", AES 37th Int. Conf., 2009].

Digital implementation of a loop-filter in combination with feedback after an output filter does require an ADC to digitize the output signal. This ADC preferably has a high-resolution for audio-grade signal conversion in combination with a low latency to avoid degradation of the loop stability. The ADC is preferably also tolerant towards a residue of high-frequency switching components.

A combination of above ADC requirements in full or in part is atypical. The requirements could be met by using either a costly overdesigned general purpose ADC [e.g. Mouton above], or by using an ADC that is specially tailored for the application [WO 2014/094913 A1].

Various patent documents recite digital amplifiers.

A very generic patent is WO 2002/078179 A1, relating to class D amplifiers with digital processing in many varieties.

U.S. Pat. No. 6,498,531 B1 recites a system with analog to digital converters for feedback, both before and after an output filter, being an embodiment of a real digital feedback amplifier. Said system is, with its two feedback loops, not optimized for high loop gain and only has a first-order loop-filter.

WO 2009/153449 A1 and WO 2009/153450 A1 recite Digital-input Class-D Audio Amplifiers with digitized feedback in combination with secondary local feedback loops.

Some examples of prior art programmable pulse width modulators can be found in DE 10 2012 102504 A1, US 2005/052304 A1, and WO 2013/164229 A1, whereas Iftekharuddin et al. in Applied Optics, Optical Soc. America, Washington D.C., Vol. 33, No. 8, Mar. 10, 1994, p. 1457-1462 describes background art relating to a butterfly interconnection network. DE 10 2012 102504 A1 recites a PWM in a data-converter which uses adaptable limiters, but is otherwise considered not very flexible as it can not be adapted nor programmed as a whole, let alone individual components thereof. For instance the loop filters 300 are not programmable, as the coefficients have fixed values. It shows only one PWM having two outputs, which outputs are inherently dependent of one and another. It comprises a multiplexer for selecting inputs, but it is not capable of mixing signals. US 2005/052304 A1 recites a PWM modulation circuitry with multiple paths that are nominally out of phase and are combined in an analog summer. But again, the loop-filter components are not programmable nor can their outputs be mixed. Instead, they perform a dedicated noise-shaping function specific for this data converter. WO 2013/164229 A1 describes a class-D audio amplifier with adjustable analog loop filter, but this adjusting is done automatically between a limited number of pre-defined options, depending on the modulator frequency setting. This is very different from the fully programmable digital multi-purpose loop-filter presented here.

It is an objective of the present invention to overcome disadvantages of the prior art digital audio converter and amplifier controller without jeopardizing functionality and advantages.

SUMMARY OF THE INVENTION

The present invention relates in a first aspect to a programmable pulse width modulating (PWM) controller, such as for use in a digital audio converter or digital amplifier controller, according to claim 1, in a second aspect to a device comprising said converter and controller, in a third aspect to a use of said device, and in a fourth aspect a product comprising said device. The present invention relates to a digital part that can be implemented to enable a versatile, yet still cost-effective, controller. The present programmable PWM controller provides robust loop filters with a lower Total Harmonic Distortion (THD) over the entire audio band. In an example the THD is less than 0.004% relative for input signals over the entire audio-band (20 Hz-20 kHz), as can be seen in FIG. 2b which relates to results of measurements. In an example the present controller can be used in a high-end audio amplifier and an active loudspeaker system. Applications also encompass an A/D converter, a power supply controller, a motor controller, and combinations thereof. It can also be used to control an active noise reduction system, as a general-purpose high-speed closed loop controller, and as a high resolution low latency data converter. An example of the present controller comprises eight channels, which are independently configurable; the configuration can easily be extended to e.g. a multiple of eight channels. Likewise controllers can be used in parallel. Also not all channels need to be used, in that case leaving some redundancy. The controller may comprise one or more ADC's, typically one ADC per channel. Typically a dynamic range of said ADCs is in the order of up to 120 dB. Sample rates of the ADC are typically in the range of several megahertz to enable low latency. The present controller provides typically volume control and soft mute modes. Some details of the present programmable mixed-signal PWM controller are provided in the description and figures.

The present FWM controller comprises at least two parallel loop filters for loop-gain and signal processing, preferably at least four loop filters, more preferably at least eight loop filters (see e.g. FIG. 3). The loop filters comprising multiple inputs and at least one, i.e. a single, output (MISO). Typically a relatively large number of inputs per loop filter may be present, such as 5-100 inputs, preferably 10-50 inputs, more preferably 20-40 inputs, such as 25 inputs. For instance in case of eight parallel loop-filters 8*3 feedback signals may be provided, a first feedback signal relating the local PWM digital signal, a second relating to the digital signal that represents a differential input voltage of the ADC and a third signal that represents a common-mode input voltage of the ADC. The $25^{th}$ signal is then the input signal that is provided by the digital interface (also referred to as PCM signal). For four parallel loop filters 4*3+1=13 signals would be present. A general formula could be N*3+1 with N the number of channels and N≥2. In systems without a local PWM feedback a similar reasoning leads to N*2+1 signals. In systems without PWM feedback and without common-mode ADC signal it would lead to N+1 signals. Each output is in electrical connection with at least one butterfly mixer (see FIG. 7). The at least one butterfly mixer is capable of mixing at least two inputs and of providing at least two mixed outputs. By mixing inputs a further improved output signal is obtained. The outputs are provided to at least two parallel pulse width modulators (PWM's), preferably 4 parallel PWM's, more preferably 8 parallel PWM's. A number of loop filters is preferably equal to a number of PWM's. The present loop filters, butterfly mixer, and PWM's are individually and independently programmable and adaptable (FIG. 3), such as for use in feedforward signal processing or use in feedback loops; the loop filter input 15 can be adapted to use at least one (or a summation of multiple) of the PWM processed output signals (45) as input to create local feedback loops; the loop filter can also be adapted to use the output of at least one (or a summation of multiple) of the ADCs (300) as input; the PWM outputs (55) can be used to drive an external circuit, for example a class-D power stage, which output signals can be digitized by the ADC's, thereby forming a global 'mixed-signal' feedback loop; alternatively, the ADCs can also be used to digitize another input signal, enabling further signal processing by the loop-filter in a feedforward way. Therewith the present PWM controller can be adapted easily, optimized for a given application, a signal to noise ratio be improved, etc.

Thereby the present invention provides a solution to one or more of the above mentioned problems.

Advantages of the present description are detailed throughout the description.

DETAILED DESCRIPTION OF THE INVENTION

The present invention relates in a first aspect to a PWM controller according to claim 1.

In the present controller a loop filter is programmable and adaptable to perform at least one of interpolation of the pulse code modulated (PCM) input signal, common mode control, differential mode control, audio processing, audio filtering, audio emphasizing, and LC compensation (see e.g. FIG. 4). A loop filter being programmable and adaptable and capable of performing the mentioned actions is considered a significant advantage over the prior art controllers. The present controller provides a large degree of freedom in design and/or in operation, for instance to arrange the present controller to align with a desired architecture.

In the present controller a loop filter input (15) is adapted to receive at least one of in a feedback loop a local digital PWM processed output signal (45), and an ADC output.

The present controller comprises at least one setting data storage means (440) for loading, adapting and storing programmable and adaptable settings.

In the present controller a loop filter input (15) is adapted to receive at least one of in a feedback loop a local digital PWM processed output signal (45), and an ADC output (see e.g. FIG. 3). For specific circumstance such provides further advantages; for instance, when ramping up the loop supports the process, or in a similar way when an ADC is absent or not used, the local feedback loop supports the controller. When the present controller is used for signal processing alone a feedback may be absent.

In the present controller a PWM comprises a carrier signal 38 with an adaptable and programmable shape, phase and frequency (see e.g. FIG. 10, element 39), wherein the carrier signal is compared by the pulse width modulator 42 with the input signal 35 to create an output signal 45 (see e.g. FIG. 10).

In an exemplary embodiment of the present controller the loop filter comprises at least 3, preferably at least 5, more preferably at least 7 filter stages 75 (see e.g. FIG. 5-6). Depending on boundary conditions and requirements e.g. 4-9 filter stages may be used, such as 6 and 8; more filter stages clearly attributed to costs and complexity, so in view thereof a number of filter stages is typically limited. Each stage comprises at least one of (a) an input 11 having at least one coefficient 80, (b) a feedback coefficient 82, (c) a feed forward coefficient 81, (d) an adder 71, (e) an output 24 having at least one coefficient 90, and (f) a register 85 comprising a processed signal. Said coefficient may scale (multiplies) said signal by a programmable factor. A processed signal after the adder may be re-quantized to let a word-length thereof fit in the width of the register (f). Noise-shaping can be applied by feeding back this quantization error back into the adder in subsequent samples. An exemplary embodiment uses two registers to store past quantization errors and hence applies so-called '2nd-order noise-shaping'. Therewith the present controller is very versatile, in number of components used, in adaptability towards a given input, in output performance, etc.

It is noted that prior art analog systems at the best comprise a limited number of filter stages, usually only two and at the best about four. For a second order analog loop filter, which in terms of function is to some extent comparable to the present loop filter, the loop-gain starts already to drop at about 1 kHz whereas the total harmonic distortion (THD) degrading at higher frequencies (typically above 20 kHz). In contrast the present digital loop filter has high loop-gain up to 20 kHz and a unity-gain frequency of around 100 kHz, and a PWM switching frequency of 350 kHz.

The present controller comprises at least one data storage means 440, such as a register or a memory, capable of storing at least one of a clipping level, and a zero detection, wherein clipping levels and zero detection of the stored signals 85 are individually and independently programmable. For instance a width of a zero detection window is programmable; if a signal falls within this window the zero-detection (signal) becomes active.

In an exemplary embodiment the present controller comprises at least one adaptable and programmable linear ramp generator with feed-in coefficients 60-62. Such provides for at least one of input volume control 60, controlling cross-fading typically between feedback signals 61,62, and gradual application of DC offset (see e.g. FIG. 5, elements 60-62).

In an exemplary embodiment the present controller comprises at least one setting data storage means 440 for loading, adapting and storing programmable and adaptable settings, such as a register or a memory.

In an exemplary embodiment of the present controller the butterfly mixer comprises at least two stages, wherein in an initial stage outputs of two loop filters are mixed forming a mixed initial stage output, and wherein in a further stage outputs of two mixed previous stages are mixed forming a mixed further stage output (see e.g. FIG. 7-9). The mixing adds MIMO (multi-input multi-output) filtering capabilities to the system, increasing its versatility and enabling use in systems where multiple signal modes need to be controlled.

In an exemplary embodiment of the present controller the butterfly mixer comprises at least three or more stages, such as 4-8 stages, e.g. 5-6 stages (FIG. 7-9). In principle each additional stage provides further improvement. In addition flexibility and programmability is enhanced with each further stage. It is noted that with n stages $2^n$ inputs may be mixed. In principle any input can be mixed with another input.

In an exemplary embodiment of the present controller a carrier signal 38 of a first channel is programmed to be phase synchronous and/or frequency synchronous with a carrier signal 38 of another channel. Sometimes, for a given application, such is a boundary condition of operation the present device. Sometimes two or more channels are e.g. phase synchronous. Sometimes multiple PWM signals with different phases are used to control a single amplifier, and so on. Thus the present controller can also be adapted and programmed in this sense.

In an exemplary embodiment of the present controller the PWM a carrier signal 38 is absent or disabled 41 to leave a channel "free running" without enforcing fixed-frequency PWM; effectively this is another available option with the present device. (see e.g. FIG. 10).

In an exemplary embodiment the present controller comprises at least one digital input interface (see e.g. FIG. 11, element 410) adapted to read-in pulse code modulated (PCM) digital signals and thereby providing input 10 to the loop filters 20, typically one PCM per loop filter (see e.g. FIG. 3).

In an exemplary embodiment the present controller comprises at least one analog digital converter (ADC) for converting an analog signal into a digital signal, typically one ADC per loop filter (see e.g. FIG. 3). Such an ADC was not available until recent.

In an exemplary embodiment of the present controller the PWM's 40 provide output 45 to at least one crossbar 50, the crossbar comprising at least two outputs 55, preferably at least four outputs, a number of outputs typically being equal to the number of PWM signals 55 (see e.g. FIG. 3). Advantages thereof are e.g. that at a higher level (non-chip), e.g. on a PCB, design becomes easier and has a larger degree of freedom.

In an exemplary embodiment of the present controller the crossbar is adapted to permute at least two outputs 55.

In an exemplary embodiment the present controller comprises supplementary processor 400 for at least one of interpolation of a PCM-input signal, and decimation of a loop-filter output signal (see e.g. FIG. 11, element 400). Such improves the present signal further.

In an exemplary embodiment the present controller comprises a filter 500 for processing loop filter output by down-sampling before the filter output is passed to a digital output interface (see e.g. FIG. 11, element 500). The filter may be a moving average filter.

In an exemplary embodiment the present controller comprises a filter 500 for processing loop filter output by down-sampling before the filter output is passed to a subsequent processor (see e.g. FIG. 11). The filter may be a moving average filter.

The two above embodiments relating to down-sampling with the simple filter set-ups may help to mitigate disadvantages relating to insufficient capacity of post-processing at the typically high sample-rate used in the loop-filter.

In an exemplary embodiment the present controller comprises a pre-filter 450 for reducing the high-frequency quantization noise in the feedback signals to the loop-filter 15.

In a second aspect the present invention relates to an integrated circuit comprising a programmable PWM controller according to the invention.

In a third aspect the present invention relates to an electronic device comprising an integrated circuit according to the invention or a programmable PWM controller according to the invention. Examples thereof are an audio amplifier, an active loudspeaker system, an active noise reduction system, a high-speed closed loop controller, a high resolution low latency data converter, an A/D converter, a power supply controller, a motor controller, and combinations thereof.

The invention although described in detailed explanatory context may be best understood in conjunction with the accompanying examples and figures.

SUMMARY OF FIGURES

FIGS. 1*a-d*, 2*a-b*, and 3-11 show details of the present controller.

DETAILED DESCRIPTION OF FIGURES

The figures are of an exemplary nature. Elements of the figures may be combined.

Figure 1A:
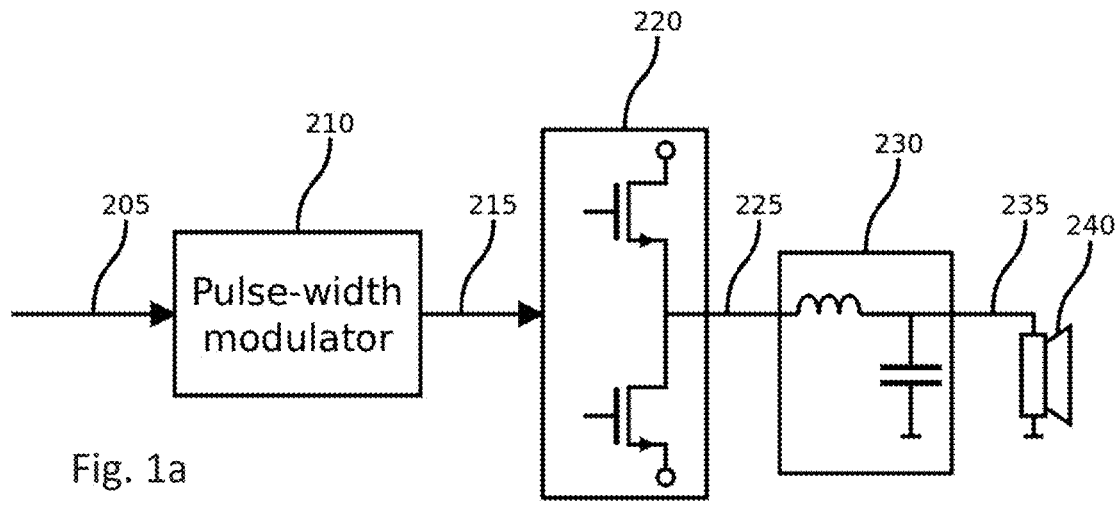

In the figures:
10 PCM input signal
11 filter stages input
12 scaled copy of input signal
15 PWM and ADC feedback signals
16 input further channel
17 output last filter stage
20 programmable loop filter
22 adder input
23 adder output
24 stage output signals
25 output signal loop filter
30 butterfly mixer
31 (identical) butterfly element
35 output signal butterfly mixer/PWM input
36 programmable PWM settings
37 programmable PWM carrier settings
38 PWM carrier
39 PWM Carrier generator
40 pulse width modulator (PWM)
41 select or disable carrier
42 subtraction
43 1-bit quantizer
44 select normal or inverted output
45 PWM output signal
50 crossbar
55 controller output signals
60-62 feed-in coefficients
65-66 input selector/combiner
70 first filter stage signal summation
71 normal filter stage summation
75 filter stage
76 stage input signal
77 stage output signal
78 stage feedback signal
80-82 scaling coefficients
85 storage register
90 output coefficient
95 adder
100 (digital) controller
105 butterfly input
110 input scaling (e.g. 50%)
115 input selection
125 programmable adder
130 programmable adder output
135 programmable clipper
140 clip residue
145 inverter
150 multiplexer
155 adder
160 butterfly output signal
200 integrated circuit
201 digital input
202 subtractor
203 subtractor output
204 digital loop filter
205 analog or digital input signal
206 subtractor
207 residue signal
208 analog loop filter
209 analog loop filter output
210 analog pulse width modulator
211 digital loop filter output
212 digital PWM
215 PWM output
220 power stage
225 power stage output
227 feedback network
228 feedback network output
229 ADC output
230 output filter (LC)
231 auxiliary feedback loop(s)
232 auxiliary feedback signal
235 output filter output/load input
240 load
300 analog to digital converter (ADC)
305 differential mode ADC outputs
310 common mode ADC outputs
315 analog ADC inputs
400 (optional) digital signal processor (DSP)
405 serial interface input
410 serial digital data interface
415 serial interface output
420 clock generation unit
430 control interface
435 control interface output
440 control/settings registers
445 control register outputs
450 optional pre-filter for the feedback signals (15)
500 simple decimation filter ($1^{st}$ stage decimator)
505 decimation filter output FIG. 1a (prior art) shows a traditional class-D switching amplifier without feedback, where an analog or digital in-put signal (205) is fed into a pulse-width modulator (210), which output (215) controls the power stage (220). The power stage output (225) passes through an (LC) output filter (230) before it arrives at the load (240).

Figure 1B:
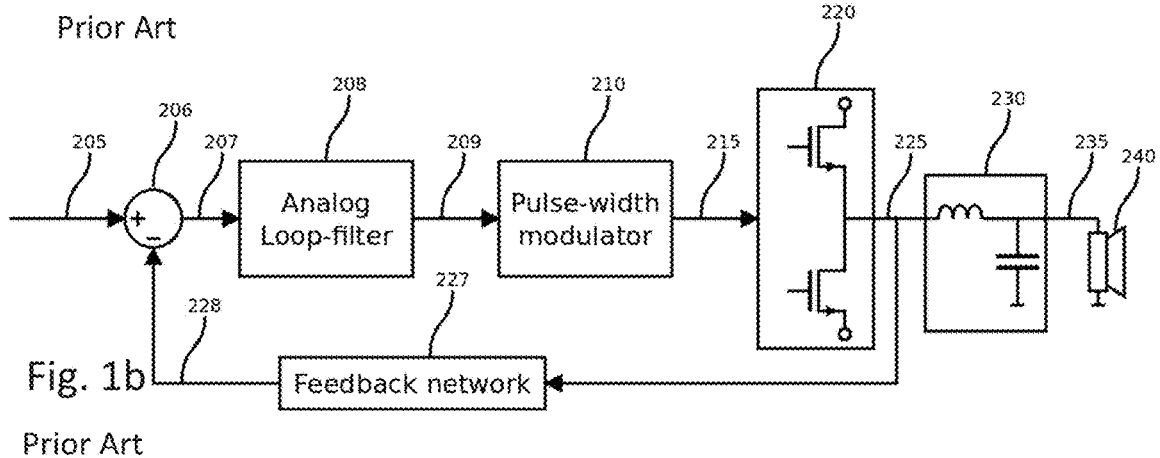

FIG. 1b (prior art) shows a switching amplifier similar to FIG. 1a, but now with analog feedback. The output of the power-stage is fed back through a feedback network (227) and the result (228) is subtracted from the analog input (205). The residue (207) is fed to an analog loop-filter (208). Such a feedback (control) system keeps the residue (207) small in those frequency regions where the loop-filter has suitable gain. This results in a suppression of errors generated by the PWM (210) or output stage (220).

Figure 1C:
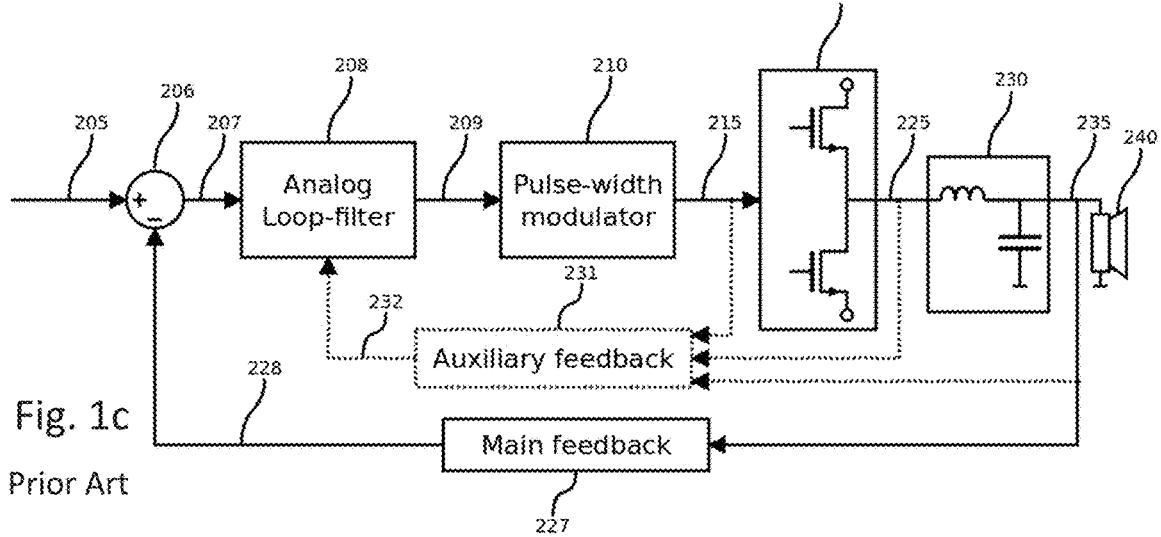

FIG. 1c (prior art) shows a switching amplifier similar to FIG. 1b, but now including analog feedback from after the output filter (228). The control principle is similar as in the system of FIG. 1b, but with a further benefit that error from the output filter (230) are now also suppressed. Incorporation of the output filter in the feedback loop does complicate the design of the loop-filter. To keep the loop stable, auxiliary feedback loops are usually added (231).

FIG. 1d shows a switching amplifier with a digital controller (100). The output (235) is digitized by an analog to digital converter (300). The control strategy is similar as for the analog feedback loop from FIG. 5c, but with the benefit that it is much easier to design complex filters in the digital domain that achieve good error suppression while keeping the feedback loop stable.

Figure 2A:
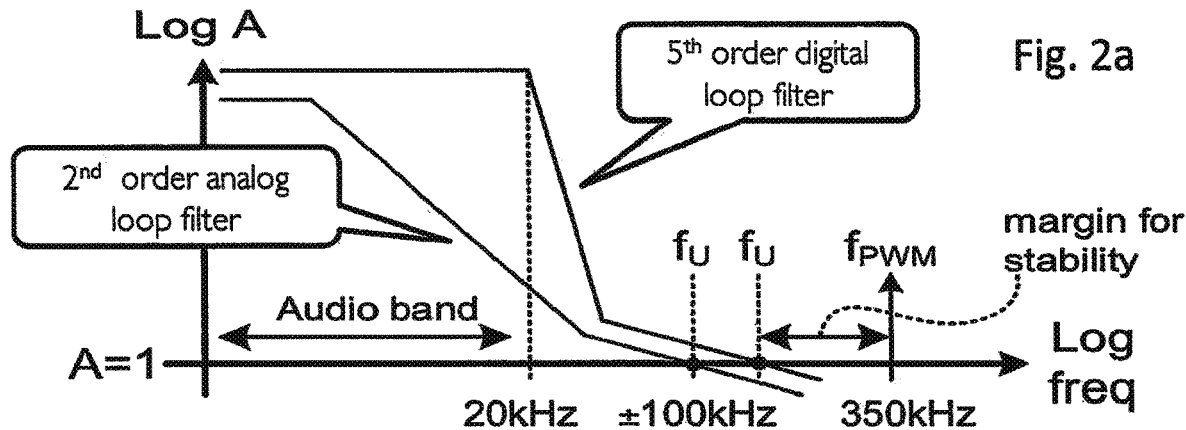

FIG. 2a shows an example of how a $5^{th}$ order digital loop-filter is able to achieve much higher loop-gain compared to a 2nd order analog filter.

FIG. 2b shows measured THD+N results at the output of a 100 W power amplifier that uses the present controller.

Figure 3:
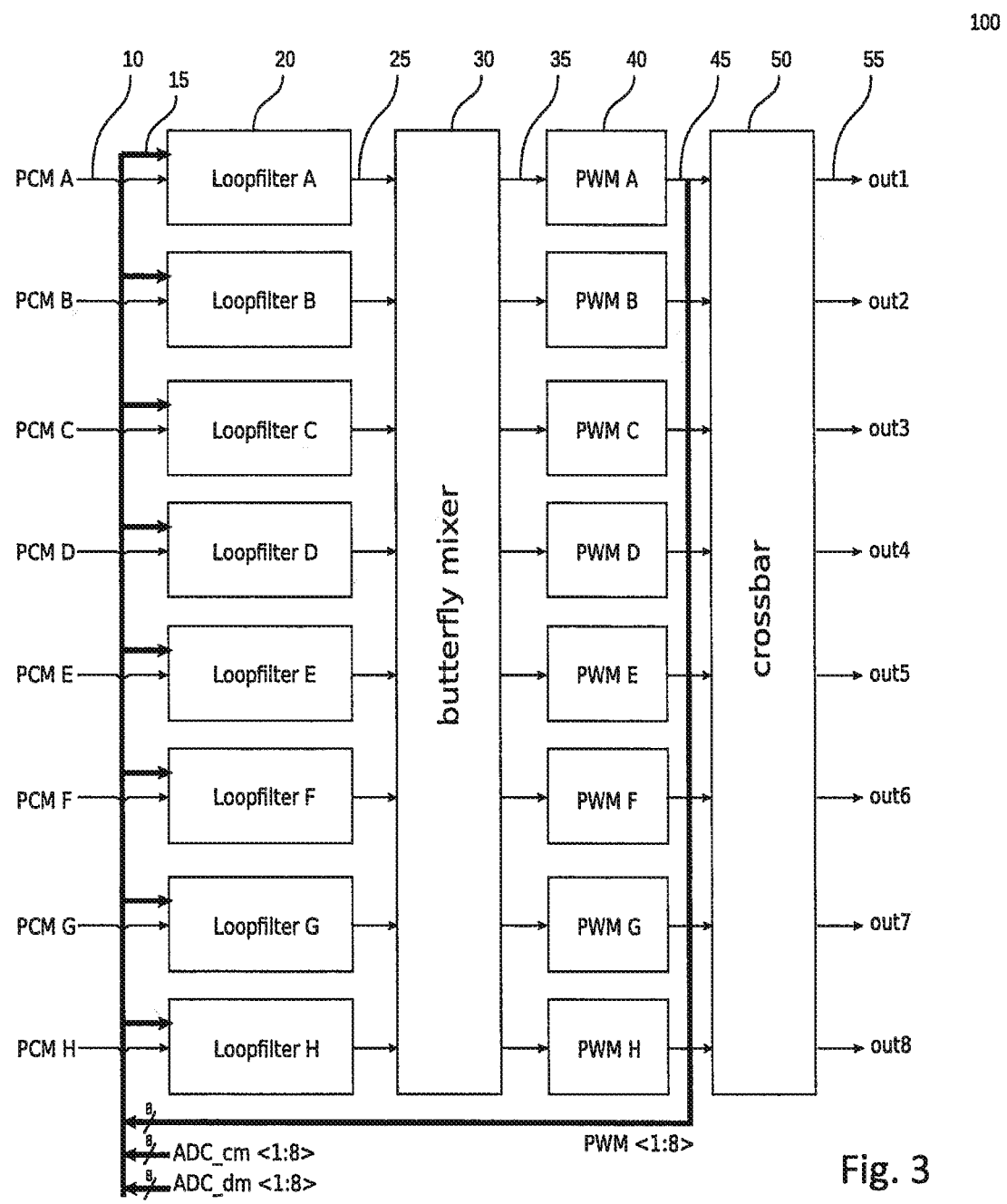

FIG. 3 shows a digital core of the programmable PWM controller. The input (10) and feedback signals (15) enter the loop-filters (20) on the left, after the signals are filtered by the programmable loop-filters they (25) are fed to the butterfly mixer (30), which can make combinations of various loop filter outputs. The resulting signal (35) is fed to the actual pulse-width modulators (40). The crossbar (50)

can permute the pulse-width modulated signals (45) before they are output (55) by the system.

Figure 4:
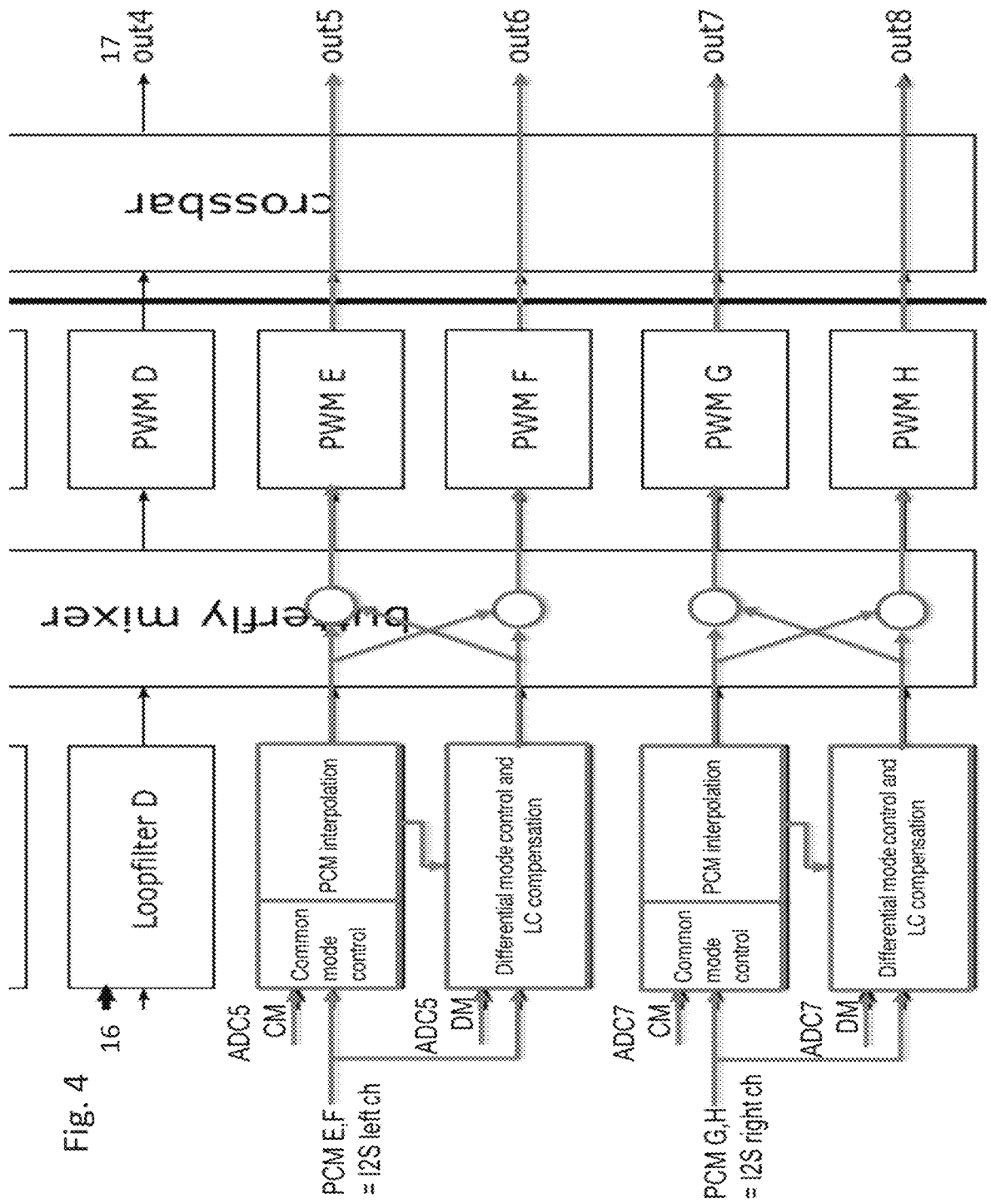

FIG. 4 shows an exemplary configuration of the controller for use in a stereo audio amplifier with H-bridge power stages and with each bridge driven by two PWM signals that are a mix of a common-mode loop-filter output and a differential mode loop-filter output. As the common-mode can be controlled with a low filter-order, the remaining part of these loop-filters is used to interpolate the PCM input signal. The interpolated signal is available at output of the last stage of the common-mode loop-filter (17), and is passed as input to the first stage of the differential mode loop-filter (16).

Figure 5:
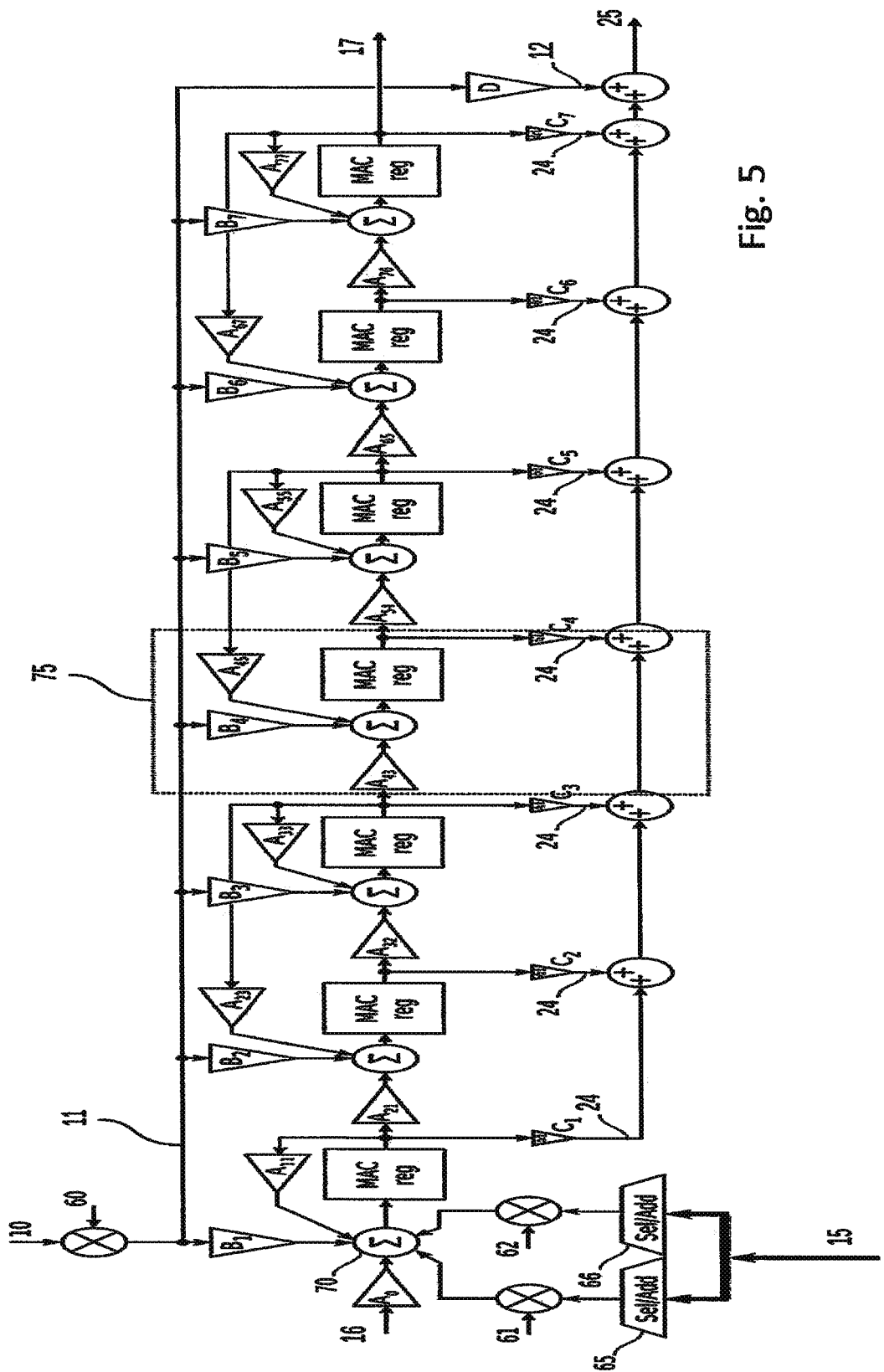

FIG. 5 shows blocks inside a single loop-filter. On the left, a programmable selection of input (10) and feedback signals (15) enter the loop-filter, where these are first processed with time-variable feed-in coefficients (60,61,62) and summed together (70). A number of cascaded loop-filter stages (75) further process the summed signal. The main output of the loop-filter (25) is formed by summing a scaled copy of the input signal (12) and a programmable selection of stage output signals (24). The output of the last filter stage (17) is an auxiliary output that can be used as input to a loop-filter in another channel (16).

Figure 6:
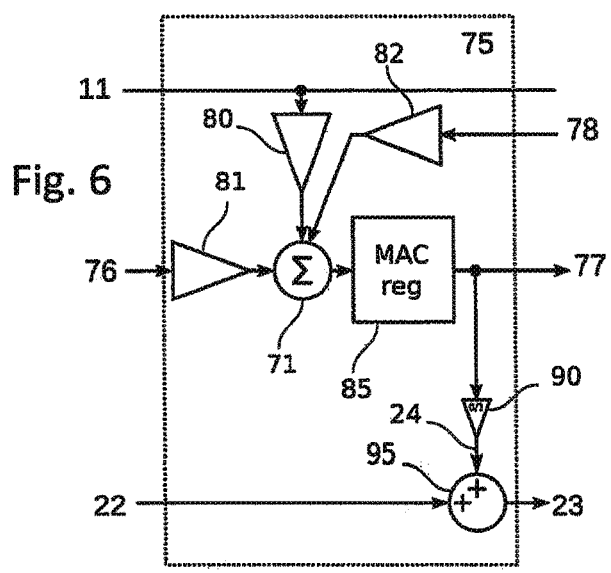

FIG. 6 shows a single loop-filter stage. It uses coefficients (80,81,82) to scale (a) the input that is shared for all stages (11), (b) the output of the previous stage (76), and (c) a feedback from this or a next stage (78). The scaled signals are summed (71) and fed to a storage register (85). The output of the register (77) is fed to the next stage and to an output coefficient (90).

Figure 7:
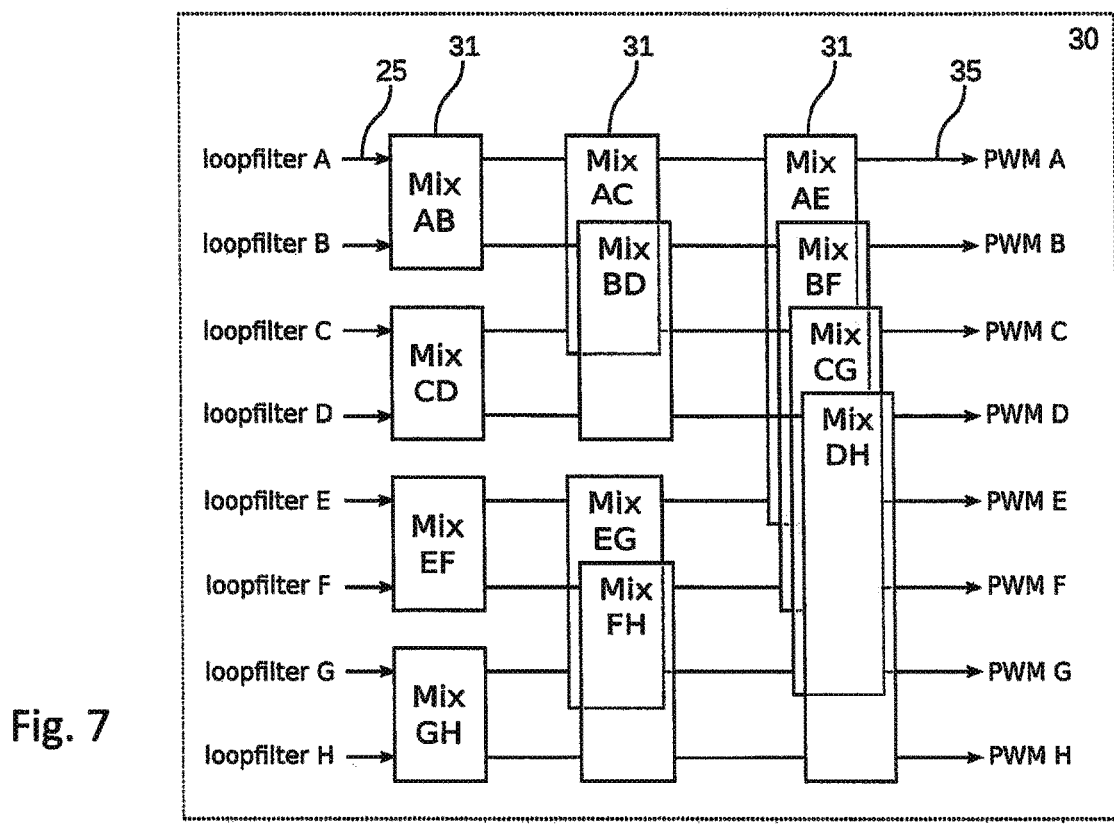

FIG. 7 shows a butterfly mixer that consists of a number of identical butterfly elements (31). The elements can be configured to mix their input signals such that a selection of loop-filter outputs (25) can be combined to create a selection of PWM inputs (35).

Figure 8:
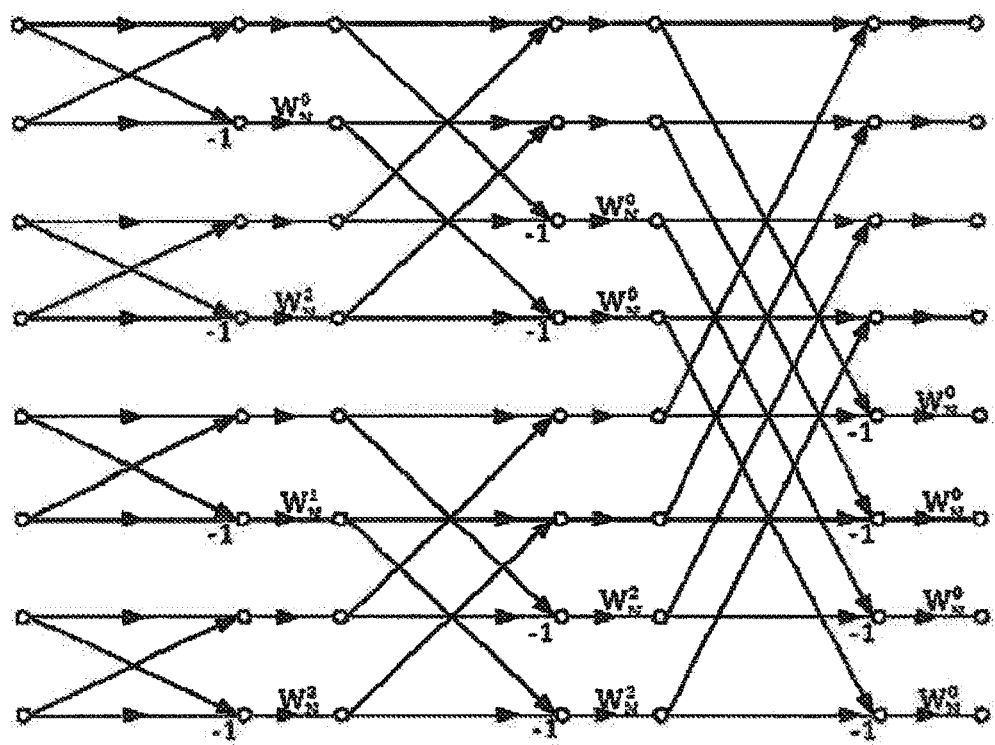

FIG. 8 illustrates the similarity of the butterfly mixer to a radix-2 decimation-in-time FFT structure, which also provides the source of the term 'butterfly element'.

Figure 9:
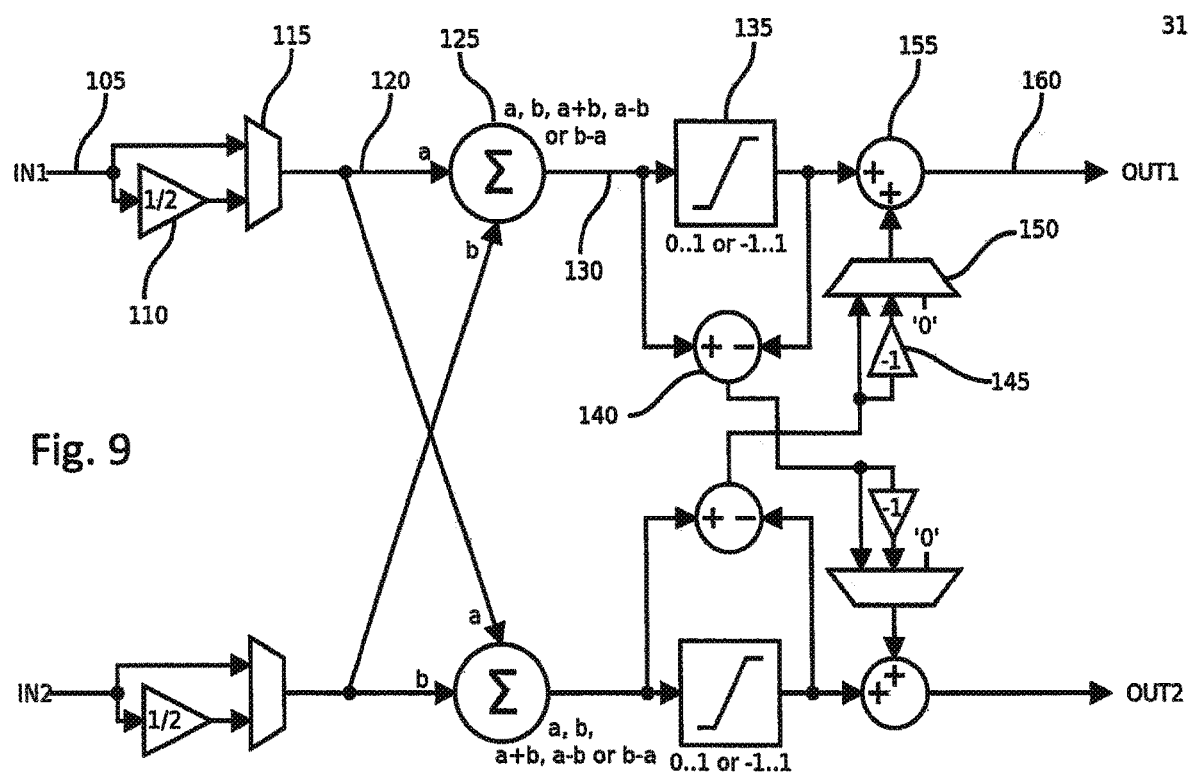

FIG. 9 shows a single butterfly element. It is a vertically symmetric structure which can scale and mix its two inputs (105) to create its two outputs (160). At the input side, either the normal input (105) or an input that is scaled by a half (110) can be selected (115). The mixing is done with the programmable adder (125) that can be configured to either pass an input, add the inputs, or subtract the inputs. The range of the mixed signals is limited with a programmable clipper (135). When the signal clips, the clip residue (140) can optionally be passed to the other side and added with the output there. This can be useful to compensate clipping errors.

Figure 10:
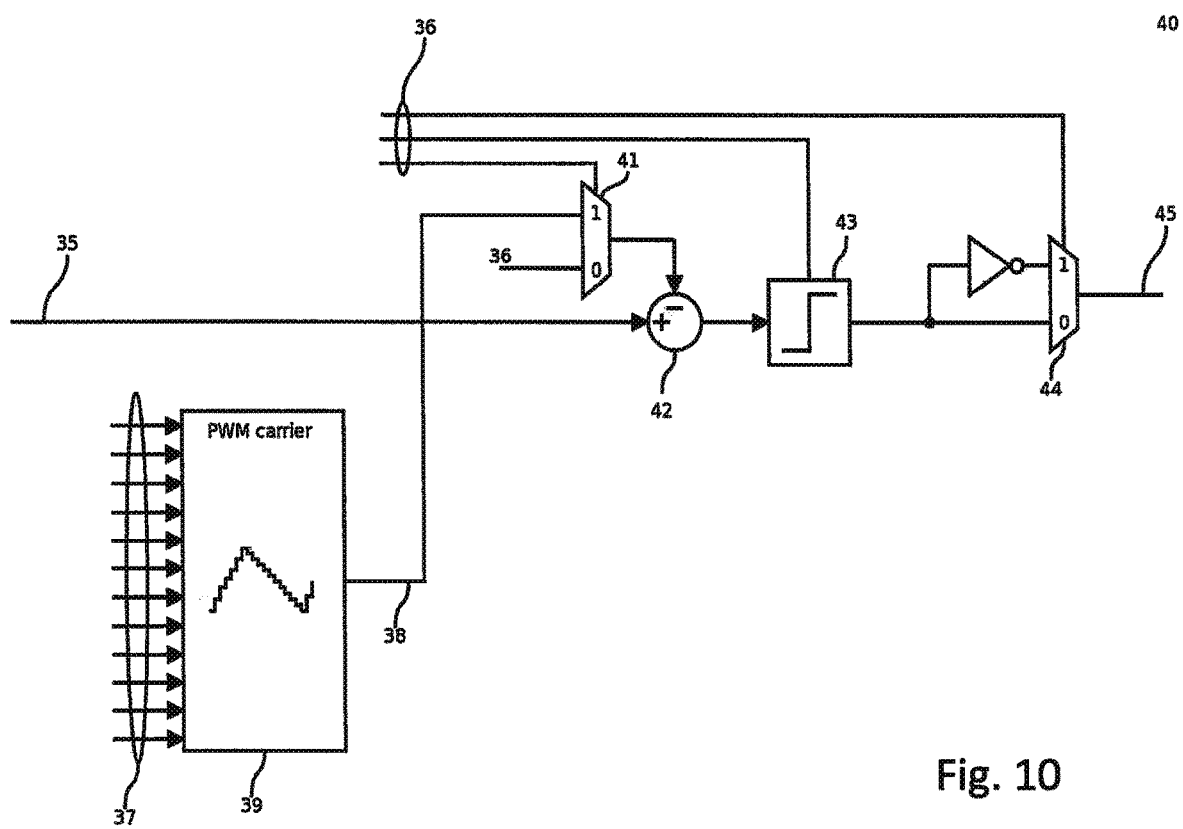

FIG. 10 shows a pulse-width modulator (PWM). A PWM carrier is generated (38,39) via a number of programmable settings (37) that control its amplitude, frequency and shape. The carrier can be compared with the input signal (42,43), but it is also possible to disable the carrier (41). The type of modulation and the polarity of the PWM output (45) can be programmed with settings (36).

Figure 11:
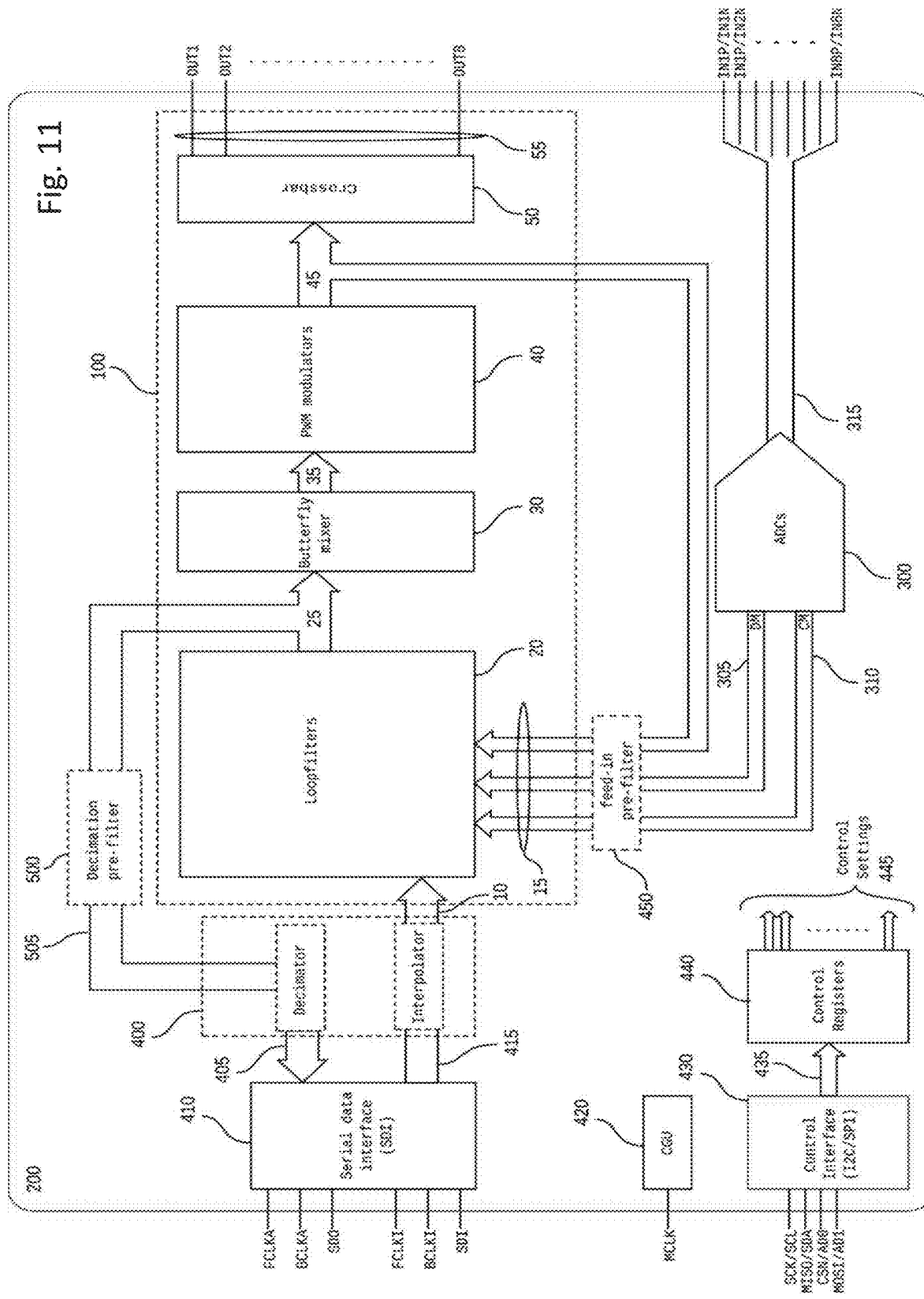

FIG. 11 shows a block diagram of an integrated circuit (200) that contains the controller (100) and ADCs (300). Other notable blocks are a clock generating unit (420), a digital data interface for the PCM signals (410) and a digital control interface (430). The control interface can be used to read or write the control settings (445) into or from a storage means such as a bank of registers (440). Around the controller, there are also a few optional blocks. The first is a simple pre-filter (450) that can be used to reduce the high-frequency quantization noise from the ADC or PWM signals. The second is a simple decimation filter (500), for feeding the output of the loop filter back to the serial data interface (410), or to a more advanced $2^{nd}$ decimation stage. This second decimation stage can be part of an optional digital signal processor (400), which can also be used to provide interpolation and other auxiliary sound processing functions.

The invention claimed is:

1. A programmable pulse width modulating (PWM) controller comprising in series
   (i) at least two parallel loop filters for loop-gain and signal processing, each loop filter comprising multiple inputs and at least one output, wherein a loop filter is adapted to perform at least one of interpolation of the pulse code modulated (PCM) input signal, common mode control, differential mode control, audio processing, audio filtering, audio emphasizing, and LC compensation,
   wherein each single output being in electrical connection with
   (ii) at least one butterfly mixer, the butterfly mixer being capable of mixing at least two inputs and of providing at least two mixed outputs to
   (iii) at least two parallel pulse width modulators (PWM's), wherein a pulse width modulator comprises a carrier signal with an adaptable and programmable shape, phase and frequency, wherein the carrier signal is compared by the pulse width modulator with the input signal to create an output signal,
   wherein (iv) loop filters, butterfly mixer, and PWM's are individually and independently programmable and adaptable,
   wherein loop filter input is adapted to receive at least one of a local digital PWM processed output signal, and an ADC output, and
   comprising at least one setting data storage for loading, adapting and storing programmable and adaptable settings.

2. The programmable PWM controller according to claim 1, wherein the loop filter comprises at least 7 filter stages.

3. The programmable PWM controller according to claim 2, wherein each stage comprises at least one of (a) an input having at least one coefficient, (b) a feedback coefficient, (c) a feed forward coefficient, (d) an adder, (e) an output having at least one coefficient, and (f) a register comprising a processed signal.

4. The programmable PWM controller according to claim 1, comprising at least one data storage capable of storing at least one of a clipping level, and a zero detection, wherein clipping level and zero detection of the stored signal are individually and independently programmable.

5. The programmable PWM controller according to claim 1, wherein the butterfly mixer comprises at least two stages, wherein in an initial stage outputs of two loop filters are mixed forming a mixed initial stage output, and wherein in a further stage outputs of two mixed previous stages are mixed forming a mixed further stage output.

6. The programmable PWM controller according to claim 5, wherein the butterfly mixer comprises at least three or more stages.

7. The programmable PWM controller according to claim 1, wherein a carrier signal of a first channel is programmed to be phase synchronous and/or frequency synchronous with a carrier signal of another channel.

8. The programmable PWM controller according to claim 1, wherein a carrier signal is disabled to leave a channel free running without enforcing fixed-frequency PWM.

9. The programmable PWM controller according to claim 1, comprising at least one digital input interface adapted to read-in pulse code modulated (PCM) digital signals and thereby providing input to the loop filters.

10. The programmable PWM controller according to claim 1, further comprising at least one analog to digital converter (ADC) for converting an analog signal into a digital signal.

11. The programmable PWM controller according to claim 1, wherein the PWM's provide output to at least one crossbar, the crossbar comprising at least two outputs, a number of outputs being equal to the number of PWM signals.

12. The programmable PWM controller according to claim 11, wherein the crossbar is adapted to permute at least two outputs.

13. The programmable PWM controller according to claim 1, comprising at least one adaptable and programmable linear ramp generator with feed-in coefficients, for at least one of input volume control, controlling crossfading between feedback signals, and gradual application of DC offset.

14. The programmable PWM controller according to claim 1, comprising a subsequent processor for at least one of interpolation of a PCM-input signal, and decimation of a loop-filter output signal.

15. The programmable PWM controller according to claim 1, comprising an output filter for processing loop filter output by down-sampling before the filter output is passed to a digital output interface, or to a/the subsequent processor.

16. The programmable PWM controller according to claim 1, comprising a pre-filter for reducing high-frequency quantization noise in feed-back signals to the loop-filter.

17. An integrated circuit comprising a programmable PWM controller according to claim 1.

18. An electronic device comprising an integrated circuit according to claim 17 or a programmable PWM controller according to claim 1, selected from an audio amplifier, an active loudspeaker system, an active noise reduction system, a high-speed closed loop controller, a high resolution low latency data converter, an A/D converter, a power supply controller, a motor controller, a digital audio converter, a digital amplifier controller, and combinations thereof.

* * * * *